United States Patent [19]

Joshi et al.

[11] Patent Number: 5,439,780
[45] Date of Patent: Aug. 8, 1995

[54] ENERGY SENSITIVE MATERIALS AND METHODS FOR THEIR USE

[75] Inventors: Ajey M. Joshi, Somerset; Timothy W. Weidman, Maplewood, both of N.J.

[73] Assignee: AT&T Corp., Murray Hill, N.J.

[21] Appl. No.: 875,851

[22] Filed: Apr. 29, 1992

[51] Int. Cl.⁶ .................................................. G03C 5/00
[52] U.S. Cl. .................................... 430/296; 430/270; 430/311; 430/313; 430/323; 430/325; 430/326; 430/330
[58] Field of Search ............... 430/296, 311, 313, 323, 430/325, 326, 330, 270

[56] References Cited

U.S. PATENT DOCUMENTS

| | | | |
|---|---|---|---|
| 4,283,482 | 8/1981 | Hattori et al. | 430/296 |
| 4,357,369 | 11/1982 | Kilichowski et al. | 430/296 |
| 4,426,439 | 1/1984 | Kobayashi et al. | 430/296 |
| 4,459,338 | 7/1984 | Angelini et al. | 428/218 |
| 4,476,216 | 10/1984 | Tobias | 430/296 |
| 4,481,279 | 11/1984 | Naito et al. | 430/296 |
| 4,537,942 | 8/1985 | Brown-Wensley | 528/12 |
| 4,588,675 | 5/1986 | Nakane et al. | 430/296 |
| 4,719,273 | 1/1988 | Seyferth et al. | 528/31 |
| 4,720,532 | 1/1988 | Seyferth et al. | 528/38 |
| 4,801,468 | 1/1989 | Ishihara | 427/255.2 |
| 4,806,456 | 2/1989 | Katoh | 430/296 |
| 4,921,321 | 5/1990 | Weidman | 350/96.12 |
| 4,945,028 | 7/1990 | Ogawa | 430/296 |
| 5,126,006 | 6/1992 | Cronin et al. | 430/296 |
| 5,156,881 | 10/1992 | Okano et al. | 427/255.2 |

OTHER PUBLICATIONS

Horn, M. W., et al, *Journal of Vacuum Science and Technology*, B8, 1493 (1990).
Seyferth, D., et al, *Organometallics*, 10, 537 (1991).
Allcock, H. R., et al, Eds., *Inorganic and Organometallic Polymers*, "Polymerization of Group 14 Hydrides by Dehydrogenative Coupling", J. F. Harrod, American Chemical Society, Washington, D.C. (1988).

Primary Examiner—Paul R. Michl
Assistant Examiner—Pat Hightower
Attorney, Agent, or Firm—Bruce S. Schneider

[57] ABSTRACT

A class of silicon-containing materials display excellent sensitivity in the ultraviolet and deep ultraviolet for the formation of patterns by radiation induced conversion into glassy compounds. Materials are depositable from the vapor phase and show excellent promise for use such as resists in the fabrication of electronic and optical devices.

24 Claims, 1 Drawing Sheet

ENERGY SENSITIVE MATERIALS AND METHODS FOR THEIR USE

BACKGROUND OF THE INVENTION

1. Field of the invention

This invention relates to photosensitive materials and, in particular, to photosensitive materials including silicon atoms.

2. Art Background

Photosensitivity has been found in polymers having an all silicon backbone such as in A) linear poly(diorganosilylenes), sometimes called polysilylenes or polysilanes, i.e., materials having the general formula $[R^1R^2Si]_n$ with $R^1$ and $R^2$ being various alkyl or aryl substituents and having n typically larger than 20, and B) in polysilyne network materials, i.e., materials having at least 70% of their silicon atoms bound to only one organic substituent and to three other silicon atoms.

Irradiation of linear polysilylenes with U.V. or deep U.V. light generally causes fragmentation that results after development in positive images—the unexposed regions remain after development. The photoreactivity of polysilynes is markedly different from that of polysilylenes. The polysilyne layer is exposed to ultraviolet light in the presence of oxygen to induce photooxidation with formation of crosslinked Si—O—Si networks. Such photooxidation produces a change both in solubility and in the refractive index of the oxidized relative to the unoxidized regions. The photooxidation allows selective removal by suitable solvents or halogen-based plasma reactive ion etching of the unexposed region to produce a negative image. Appropriate use of the refractive index change (if oxidized material is not removed) yields light guiding structures. Thus, photooxidation processes in polysilynes are suitable for fabrication of optical and electronic devices. (See U.S. Pat. No. 4,921,321, dated May 1, 1991.)

Soluble organosilicon films of partially characterized structure (reported in M. W. Horn et al, *Journal of Vacuum Science and Technology*, B8, 1493 (1990), to contain substantial Si—C—Si backbone bonds and an insignificant presence of Si—(Si)—Si bonds) have been deposited by plasma reaction of various volatile organosilicon compounds such as tetramethylsilane. These materials show a decrease in solubility and increased resistance to gaseous HBr or chlorine plasma etching after exposure to light at 193 nm with sensitivities of approximately 50 mJcm$^{-2}$, but are essentially transparent and not useful at longer wavelengths such as at 248 nm. For many processes such as the formation of electronic and optical devices, photosensitive materials (denominated resists) having a photosensitivity better than 200 mJcm$^{-2}$ and preferably better than 100 mJcm$^{-2}$ at or above 248 nm are required to avoid undesirably long exposure times. (Photosensitivity is defined as exposure dose required to allow the development of an imaged film capable of functioning as an effective etch mask for subsequent pattern transfer by reactive ion etching.) Furthermore, photosensitive materials requiring 193 nm light involve processing complexities which make it currently impractical.

Soluble polymeric methylhydridosilylenes have also been prepared (see, for example, U.S. Pat. No. 4,537,942, dated August, 1985, D. Seyferth and H. Lang, Oganometallics, 10, 537 (1991), J. F. Harrod, "Inorganic and Organometallic Polymers") and in U.S. Pat. Nos. 4,719,273 and 4,537,942 their use, without further explanation, for photolithography, is suggested. No comment on properties indicating suitability for resist applications was provided beyond the basic suggestion that the materials are soluble in common solvents. In this regard, the use of a resist generally depends on solubility characteristic allowing deposition of solid films from solution by spin casting or spraying and allowing the solvent to evaporate. However, it has long been a goal to form a suitable resist on a substrate by deposition from the gas phase, useful for conventional deep to mid-UV photolithography (for example, at 248, 310, or 365 nm). Such gas phase deposition is advantageous since resist formation, exposure, development, and pattern transfer would become possible within an interconnected series of chambers (sometimes called a cluster tool) without degradation resulting from exposing the wafer to the ambient.

A suitable resist useful as a photodefinable glasslike reactive ion etch mask based on silicon chemistry having acceptable sensitivities at wavelengths longer than 200 nm that is capable of being deposited from the gas phase is not presently available.

SUMMARY OF THE INVENTION

Silicon polymers deposited from the gas phase such as those represented by the formula $R_xSiH_y$, with R being an organic moiety and with $0.2 < x < 1.5$ and $0.2 < y < 1.5$, have been found to exhibit quite advantageous properties for lithographic processes. Particularly advantageous polymers are prepared by discharge deposition from the vapor phase using, for example, RSiH$_3$ precursors, e.g., methylsilane, ethylsilane or phenylsilane, to give polymers having substantial Si—(Si)$_n$—Si bonded networks.

Materials produced by plasma deposition are typically insoluble (solubility less than 20% of original weight in toluene) and, nevertheless, lend themselves to patterning and development without use of liquid processing, and, if desired, are suitable for a cluster or highly integrated processing environment. These polymers are capable of photooxidative patterning with sensitivities as good as 15 mJcm$^{-2}$ (at 248 nm), allow resolution of dimensions at least as small as 0.25 μm, and, for many processes, allow pattern development and subsequent dry etching of the underlying substrate in a single reactive ion etch sequence. Compositionally similar materials prepared by reductive condensation processes in the liquid phase from an RSi HX$_2$ (X=halogen) precursor, although not as advantageous, also offer desirable properties.

The polymers involved in the invention, which are believed to contain primarily silylene (RSiH) segments and silyne (RSi) branch points (R exemplified by alkyl, aryl and/or H), are sensitive to light in the ultraviolet and deep ultraviolet in the presence of an oxidant, e.g. oxygen, as well as to particle radiation such as electron beam radiation in vacuum or in the presence of an oxidant. Irradiation of the materials in the presence of oxygen with energy such as in the ultraviolet, e.g., 200 to 400 nm, causes formation of glassy, siloxane network materials in the irradiated regions. The unoxidized regions are advantageously removed to develop the pattern using dry halogen based reactive ion etch (RIE) processing conditions similar to those used to preferentially etch silicon relative to SiO$_2$.

Films deposited from precursors such as MeSiH$_3$ and EtSiH$_3$, are made similar in etch resistance to SiO$_2$ by photo-oxidative exposure and the pattern is developed and transferred in one step. Thus, development of the pattern, for example, using a halogen-based plasma etchant such as $Cl_2$ RIE, also allows subsequent etching with the same etching plasma of an underlying material such as polysilicon or aluminum. By changing etchant gas after development, materials such as organic polymers, III-V materials such as GaAs, InP, or their alloys, and aluminum as well as its alloys, are also patternable in the same processing step (i.e., without removal from an RIE apparatus).

DETAILED DESCRIPTION

Figure 1:
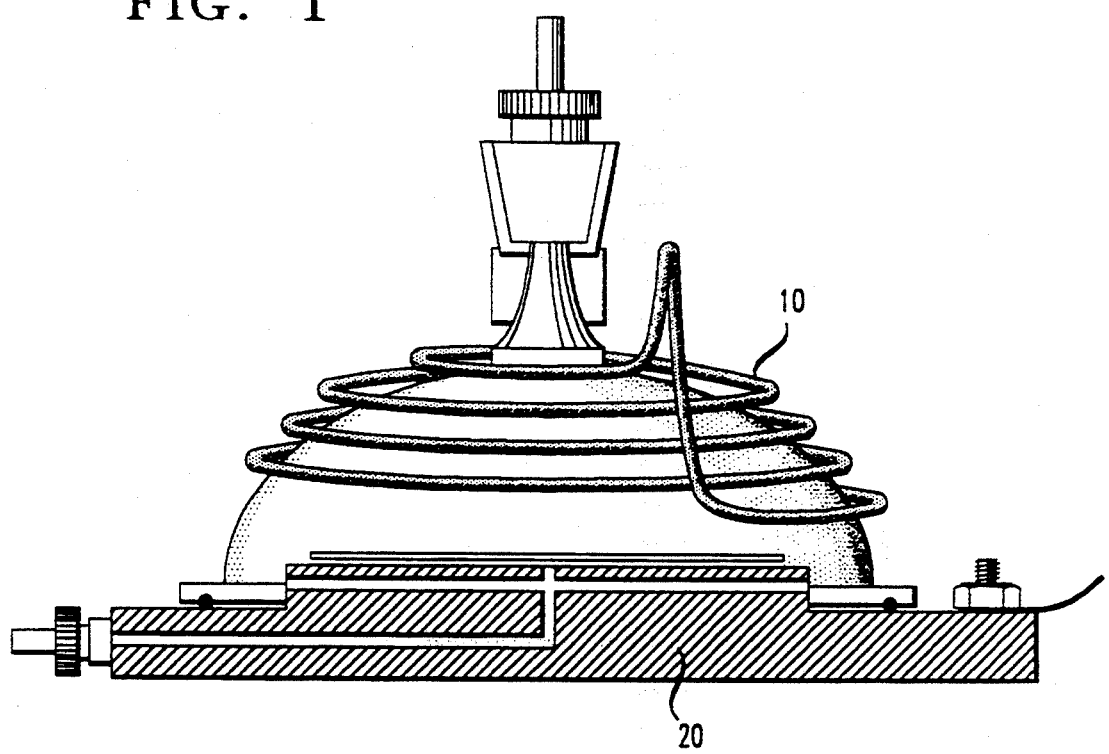
FIGS. 1 and 2 are illustrative of apparatuses useful in practicing this invention.

A class of photosensitive materials involved in the invention is represented by the formula:

$$R_xSiH_y \text{ with } 0.2 < x < 1.5 \text{ and } 0.2 < y < 1.5 \qquad (1)$$

where R is an organic substituent (small quantities of a non-organic R are not precluded). Suitable organic substituents include alkyls, such as lower alkyls (alkyls having 1 to 10 carbon atoms), aromatic moieties, such as phenyl, and other organic substituents such that the deposition precursors containing these substituents have a sufficient vapor pressure (or partial pressure when using a carrier gas) to allow useful deposition rates (deposition of at least 10 Å/min).

The particular organic substituent chosen depends on the ultimate properties desired for the silicon containing photosensitive composition. Typically, smaller substituents yield upon photooxidation material exhibiting a greater increase in etch resistance relative to unexposed material. Aromatic substituents such as phenyl while having lower etch selectivity between exposed and unexposed regions, generally yield material of greater thermal and oxidative stability.

It is possible to synthesize and deposit the materials involved in the invention through a variety of techniques. For example, precursors represented by the formulae:

$$RSiH_3 \text{ and/or } R_2SiH_2$$

where R is as defined supra are subjected to a low energy discharge. (A combination of precursor gases is also useful.) It is also possible to add in small quantities other gases such as silane to influence properties such as the absorption characteristics or film density. For dry deposition, the discharge is typically excited by radiation in the range 500 KHz to 30 MHz. However, other discharges, such as D.C. discharges, are also suitable. Additionally, discharges such as microwave discharges generating reactive species in a region remote from the precursor and which subsequently react with the precursor are not precluded. Suitable energies depend, to an extent, on the precursor materials and processes, but generally discharges having unconventionally low energy densities in the range $2 \times 10^{-3}$ to 0.2 $Wcm^{-2}$ of substrate are employed. Generally, the discharge conditions are adjusted so that a faint but stable glow (in the pure precursor or carrier gas and precursor combination) is visually observable adjacent to the substrate in a darkened room. The exposure and processing characteristics of gas phase deposited films degrade somewhat upon exposure to oxidant or adventitious light. This instability is mitigated by using higher plasma energy densities or elevated substrate temperatures but lower exposure sensitivities result. To obtain films of highest sensitivity and achieve fastest deposition rates, it is preferable to maintain the substrate 5°-30° C. below the ambient temperature of the chamber walls of the apparatus. In contrast, plasma depositions are normally done under conditions that heat the substrate above the ambient.

Vapors of liquid precursor materials are introduced into the region of the substrate generally through use of a carrier gas. Typically, a carrier gas such as hydrogen is bubbled through the precursor material for such introduction. Generally, the partial pressure of the precursor is at least 2 mole % of the carrier gas. Use of hydrogen as a carrier gas is advantageous since it promotes a stable discharge and yields films that are less sensitive to oxygen in the dark than films deposited using pure precursor gases. Typically, flow rates of the carrier/precursor combination in the range 5 to 200 sccm per liter of reaction volume are employed. A control sample is employed to empirically establish precise flow rates, pressures, power levels, and deposition times to achieve the desired uniformity, absorption properties and photosensitivity for a given reactor geometry.

The discharge is generally struck in the precursor/carrier combination in a parallel plate reactor as described in *Plasma Deposition, Treatment and Etching of Polymers*, R. D'Agostino, Ed., Academic Press, N.Y., 1990, where the precursor is introduced through, for example, multiple openings in the upper powered electrode, or in a reactor such as the one shown in FIG. 1, where the energy (typically between 10 $mWcm^{-2}$ and 100 $mWcm^{-2}$) is coupled to the plasma through external copper coil, 10, and the gas is introduced at 20. Generally, to avoid deposition of particles it is advantageous to maintain pressures below 500 mTorr and to limit residence time of reactants in a plasma column. Deposition rates are generally in the range 50 to 500 Å/min. Film thicknesses are typically in the range 200 to 20,000 Å (preferably 500 to 5000 Å). Deposition is terminated simply by extinguishing the discharge.

Another method for producing soluble materials within the class of equation 1 is by a reductive condensation process. The resulting materials are soluble in common solvents and it is possible to apply them by conventional spin-coating techniques. However, such materials are generally less desirable than the dry deposited material because of difficulties related to instability of the solutions, to impurities (particularly NaCl and KCl byproducts) and to reproducibility difficulties. However, both the solution and dry deposited materials are advantageous because they make possible subsequent processing involving dry reactive ion etching in which development and pattern transfer are achieved in a single dry processing sequence.

Such wet synthesis involves the step of using a precursor material of the formula:

$$RSiHX_2$$

where X is halogen and R is as defined supra for materials formed by plasma synthesis. The technique employed is basically that described in U.S. Pat. No. 4,921,321, dated May 1, 1991, to promote formation of soluble yet more stable materials useful with liquid or dry (e.g., plasma RIE) developed resist. Precursors are dissolved in a solvent such as toluene, and subjected to a reagent such as NaK. For lower alkyl precursors, lower temperatures (under 50° C.) are used to avoid loss of the volatile monomer, and sonication is used to promote the reaction. The resulting materials are separated from byproducts such as sodium chloride and potassium chloride by filtration, and are generally soluble in solvents such as aromatic hydrocarbons. By forming a suitable solution and by employing conventional techniques, such as spin coating, a layer of the photosensitive material is easily produced on a device substrate such as a substrate to be formed into an electronic or optical device.

The materials of the invention are patterned or blanket converted into a glassy material by subjecting them to an oxidant such as molecular oxygen, in the presence of exposing radiation. (Exposing radiation includes radiation such as vacuum ultraviolet, deep ultraviolet, and ultraviolet as well as particulate energy such as an electron beam.) Oxidants such as oxygen containing gases including air at ambient pressure are useful. It is contemplated that deposition at low power densities and at temperatures around room temperature produces films of low density with high permeability to, and reactivity with, oxygen. Such films contain extensive Si—Si bonding and retain reactive SiH moieties that together yield efficient photooxidation processes. Through introduction of oxidant in the presence of radiation, materials containing Si—O—Si species and Si—OH species are obtained in the irradiated area. (It is possible to irradiate in a pattern or alternatively to irradiate the entire material to form an organosilicon oxide glass. Additionally, for some applications it is advantageous to deposit an underlying layer of amorphous silicon since this underlying layer is highly absorbing for typical exposing radiation and acts as an antireflection coating. The same plasma used for development transfers the pattern through the underlying amorphous silicon. The use of conventional organic antireflection coatings, however, is not precluded.)

The pattern formed by irradiation is developed by subjecting the exposed material to a developer that preferentially removes the unexposed regions at a rate substantially, e.g. at least 1.5 times, faster than it removes the exposed regions. For materials deposited from the plasma, typical developers include entities formed by striking a discharge, e.g. a plasma, in halogen containing gases such as molecular chlorine or bromine or HBr. (Such discharges are described in compendia such as *Plasma Etching; An Introduction*, D. M. Manos and D. L. Flamm, Eds., Academic Press, N.Y., 1989). For materials deposited from solution, typical developers include aromatic hydrocarbon solvents. The oxidized material is then used as a region in the device or is utilized as a mask for subsequent processing, e.g. etching of the underlying device regions. Typical etching processes are described in *Plasma Deposition, Treatment and Etching of Polymers*, R. D'Agostino, Ed., Academic Press, N.Y., 1990.

For some applications it is also possible to include additional step(s) between the development of the patterned resist and the subsequent pattern transfer to the underlayer. Such additional steps are exemplified by a) a blanket deep UV exposure in air of the developed resist mask, b) subjecting the developed resist mask to a brief $O_2$-plasma treatment or c) a combination of a) and b), to increase the overall oxygen content of the resist mask beyond that achieved in the initial photooxidative patterning step with a concomitant improved/increased selectivity during the RIE pattern transfer step.

The developed resist is used for further processing, e.g. as an etch mask for wet or plasma etching of the underlying material. Etching processes are wellknown and described in compendia such as R. D'Agostino supra. Generally, the higher the silicon weight percentage in the material before exposure the greater the selectivity in the development process. Silicon content above 20 weight percent generally yields selectivities in the range 2 to 6 for typical film thicknesses, exposures, and development conditions. To increase silicon content it is advantageous to use smaller substituents, such as ethyl and methyl.

The following examples are illustrative of methods for depositing silicon containing photosensitive materials and for exposing and processing such materials.

EXAMPLE 1

A simple apparatus useful for the dry deposition of [RSiH] hydrogenated organosilicon films is illustrated in FIG. 1. The apparatus was constructed from a 10"×¾" thick aluminum baseplate with a central 4" diameter platform elevated ¼" (the remainder of an initially 1" thick plate was removed by machining) tapped to allow attachment to a vacuum pump and pressure gauge. Into the top elevated portion of the platform were cut 8 radial channels, ⅛" thick and ⅛" deep, symmetrically distributed every 45° around its circumference, and joining the central ⅜" vacuum opening. A shallow glass bell jar enclosure with an ID of approximately 7" and height of about 4" was placed over the base and formed a vacuum tight seal with an O-ring. Coiled around the enclosure and terminating about 2" from the baseplate was a copper coil consisting of about 4 turns of a ¼" ID copper tube, following loosely the contour of the vessel but ending 2" short of the metal baseplate at its nearest point. The apparatus was placed in an inert atmosphere (argon) glovebox. A plasma was struck in the apparatus by connecting the copper coil to a high frequency spark generator operating at 4.5 MHz (Electro-Technique Products Model BD 20). All Examples were conducted at pressures ranging from 400 to 600 mTorr as read from a thermocouple vacuum gauge inserted into the aluminum base plate.

A flat, polished silicon substrate of 5 inch diameter, having the (100) crystallographic plane as its major surface, was placed on the platform, and the system was evacuated to a base pressure below 40 mTorr. (Quartz substrates were also used to measure the optical properties of films.) As indicated below in Table 1, depositions were conducted using, individually, a number of $RSiH_3$ precursors or individually dimethylsilane and tetramethylsilane, each of which was introduced through the glass diffuser inlet at the top of the enclosure. The voltage was adjusted to create a weak, stable discharge visually perceivable in a darkened room, confined to, and completely filling the enclosure above the wafer. The optical densities of the resulting films for the precursors employed are shown in Table 1.

TABLE 1

| Precursors and Optical Densities of Resulting Films: | |
|---|---|
| Precursor | Absorbance$_{248\ nm}$/1000Å ±0.1 |
| $CH_3SiH_3$ methylsilane | 0.60 |

TABLE 1-continued

Precursors and Optical Densities of Resulting Films:

| Precursor | Absorbance$_{248\ nm}$/1000Å ±0.1 |
|---|---|
| $C_2H_5SiH_3$ ethylsilane | 0.70 |
| n-$C_6H_{13}SiH_3$ n-hexylsilane | 0.20 |
| $C_6H_5SiH_3$ phenylsilane | 0.35 |
| $(CH_3)_2SiH_2$ dimethylsilane | 0.30 |

Flow rates of undiluted gaseous precursor averaged between 8 and 12 sccm (based on the measured consumption of the precursors after extended deposition runs) with the vacuum valve completely open. Flow was adjusted by using a metering valve on the inlet line. (Silane oligomers condense in vacuum pump oil and can give rise to explosive mixtures, particularly if moisture is present. Careful precautions must be taken to avoid this situation.) For liquid precursors, the hydrogen gas (typically at about 2 psig) was redirected through the vessel containing the precursor. The precursor gas was delivered until a film thickness of 1000±100 Å was achieved. The resulting film was protected from light and air by storage in a glovebox under flowing nitrogen until 10 minutes before lithographic exposure. It was exposed to the ambient under clean room illumination in a GCA 2000 KrF excimer laser stepper system operating at 248 nm). The lithographic exposure was done at doses varying from 50 to 290 mJcm$^{-2}$ by steps of 10 mJcm$^{-2}$. Oxidation was generally accompanied by a roughly 100 Å (about 10%) increase in film thickness. Both development and pattern transfer into an underlying thick layer of hard-baked Hunt Photo Resist-206 were accomplished using a helical resonator reactive ion etching (RIE) system without removing the sample from the etch chamber.

Films (about 1000 Å) were deposited from ethylsilane on top of 8000 Å of hard-baked photoresist. Exposure was accomplished as described above. The RIE development conditions are listed below in Table 2 and are similar to those typically of use for the selective etching of silicon over silicon dioxide, while those for $O_2$ are typical for the removal of organic resist materials.

TABLE 2

| Pressure, mTorr | Flow, sccm | Bias, volts | Time, s |
|---|---|---|---|
| $Cl_2$ (1850–150 watts) 1.25 | 35 | −20 | 25 |
| $O_2$ (2000–150 watts) 1.60 | 50 | −190 | 45 |

Scanning electron micrographs (SEM's) were obtained on patterns exposed with 120 and 170 mJcm$^{-2}$ total dose. The lines and spaces greater than or equal to 0.3 μm were intact for exposure doses equal to or greater than 120 mJcm$^{-2}$, with 80° side walls, low linewidth loss and no undercutting.

EXAMPLE 2

A liquid phase synthesis of material characterized as [MeSiH$_x$]$_n$ with x≈0.5 was performed in anhydrous grade solvents in an inert atmosphere glovebox equipped with a 375 watt, 20 kHz ultrasonic immersion horn. Liquid (1:1 mole ratio) Na/K alloy was prepared in the glovebox by adding potassium to an equimolar amount of molten sodium.

Synthesis of poly(methylhydridosilylene-co-methylsilyne), [(MeHSi)$_x$(MeSi)$_{1-x}$]$_n$[1]

A toluene solution (150 mL) of methyldichlorosilane, MeHSiCl$_2$, (23.0 g, 200 mmol) was placed in a jacketed beaker and cooled to 10° C. with a circulating cooling bath. The solution was irradiated ultrasonically and Na/K alloy (12.4 g, 200 mmol) was added dropwise over approximately 15 minutes. After 30 minutes of sonication, tetrahydrofuran (80 mL) was added to the thick suspension to promote further reaction, and the sonication continued for an additional two hours while the temperature of the reaction mixture remained between 45°–55° C. The suspension was stirred for 16 h at room temperature and then titrated carefully with methyldichlorosilane with sonication until a 0.5 mL aliquot that was removed from the glovebox and hydrolyzed with water gave a pH value of 6–7.

The mixture was diluted to 300 mL with toluene and filtered inside the glovebox through a Schlenk filter to give a clear yellow solution. The filtrate was concentrated to 50 mL, removed from the glovebox, and poured into 250 mL of vigorously stirred, deoxygenated methanol. The pale yellow solid that precipitated was separated by filtration, dried under a stream of purified nitrogen for 5 minutes, redissolved in minimum amount of tetrahydrofuran, precipitated from methanol, and dried again to yield 3.9 g (45%) of dry amorphous yellow polymer.

Various tests were performed on the resulting material. Solution NMR spectra were recorded on a Bruker AM-360 FT-NMR spectrometer (360 MHz for $^1H$, 90.56 MHz for MHz for $^{13}C$; 71.55 MHz for $^{29}Si$) in d$_6$-benzene solution at room temperature. Solution $^{29}Si$ chemical shifts were referenced to external hexamethyldisiloxane in d$_6$-benzene solution (7.22 ppm). Electronic spectra were measured over the range 190–510 nm on an HP-8452 UV-visible diode array spectrophotometer. Infrared spectra were obtained on a BIO-RAD FTS-60 FTIR instrument. Mass spectra were obtained on an HP-5985B quadrupole mass spectrometer using a high temperature probe and a heating rate of 30° C. min.

X-ray fluorescence measurements on the solid samples were performed on an instrument equipped with a Cr tube and a Princeton Gamma Tech detector and computer. A Dektak 3030 profilometer was used for film thickness measurements. Refractive indices of films, were determined ellipsometrically at 632 nm using a Gaertner Scientific Ellipsometric analyzer. Photochemical exposures were performed using a 1000 W Oriel Hg-Xe exposure apparatus optimized for deep UV output around 265 nm. The light intensity at the sample surface averaged 20mWcm$^{-2}$. Additionally, lithographic exposures to measure dose requirements were performed at 248 nm using a GCA KrF excimer laser stepper system and conventional integrated circuit resolution test masks.

X-ray fluorescence measurements on the resulting material showed less than 0.01 atom percent Cl relative to silicon. Solid samples exhibited an apparent tendency toward crosslinking which resulted in a substantially decreased solubility over a few days. To prevent this, the material was immediately redissolved in dry, degassed toluene and stored under nitrogen in the dark, usually as an approximately 10% w/v solution. The solution was filtered through 0.45 μm membrane filters and spun onto a suitable substrate to yield clear solid films up to 4 μm thick.

Characterization Data: NMR ($C_6D_6$, 20° C., ppm): $^1H$, $\delta = 0.45$ (br,—$CH_3$, 6H), 4.0 (br, Si—H, 1H); $^{13}C\{^1H\}$ $\delta = -9.5$ (br,—$CH_3$); $^{29}Si\{^1H\}$ $\delta = -45$, $-75.7$, $-78.5$ and $-82$ (all br). Based on the $^1H$ NMR relative integral intensities of the methyl and the hydride peaks, this material is characterized as a copolymer of methylhydridosilylene (MeHSi:) and methylsilyne (MeSi—) units: $[(MeHSi)_x(MeSi)_{1-x}]$, where x is approximately 0.5. IR (neat film on $KB_r$, $cm^{-1}$): 2955(s), 2890(s), 2103(vs, br), 1408(m), 1246(s), 1057(vs, br), 930(w), 867(vs), 764(vs), 683(s). The UV-visible spectrum of [1] (neat film on quartz) shows an absorption band edge tailing into the visible region, $\epsilon$, $\mu m^{-1}$ ($\lambda$,nm): 6.7(248), 6.1(254), 5.1(265), 4.1(280), 2.8(310), 0.12(365). MS ($T_{dec}$ onset at 300° C.), m/e: 44 ($CH_3SiH$ or $CH_2=SiH_2$). Refractive index: $1.83 \pm 0.03$.

EXAMPLE 3

A solution of the material prepared as described in Example 2 was spin coated onto a 5" substrate at 2000 rpm to give a 0.2 μm thick film. The substrate had been previously treated by spin coating with an organic planarizing layer (4 μm of the commercially available resin Hunt Photo Resist 206 that was then baked at 200° C. for 30 min.). Patterning was performed using a GCA Model 2000 Deep UV Stepper using a resolution mask with exposures between 20 and 200 mJcm$^{-2}$. Development by immersion in toluene for 30 seconds resulted in the dissolution of the unexposed regions leaving the oxidized portions. Pattern transfer to the underlying Hunt Photo Resist-206 organic layer was achieved by oxygen reactive ion etching ($O_2$—RIE) using a 13.65 MHz generator, a bias of $-375$ V, and a power density of 0.20 Wcm$^{-2}$ with a selectivity better than 100:1.

EXAMPLE 4

The procedure of Example 3 was followed, except the silicon containing layer was about 0.35 μm thick and overlaid a 1.4 μm thick layer of Hunt Photo Resist-206. Development was accomplished either by using a $Cl_2$ plasma: 1.25 mTorr; 13.65 MHz; 0.20 Wcm$^{-2}$ power density; $-20$ V bias (5:1 selectivity at 100 mJcm$^{-2}$ exposure dose). Pattern transfer was achieved as described in Example 3. Exposure doses between 70 and 120 mJcm$^{-2}$ yielded resolutions of 0.35 μm for equal lines and spaces.

EXAMPLE 5

The procedure of Example 1 was followed except in place of the high frequency spark generator a variable frequency (0.5–35 MHz) rf source, consisting of a signal generator attached to an amplifier and a matching network equipped with powermeters for reading incident and reflected power, was employed to excite the plasma. The precursors listed in Table 1 were introduced into the chamber as received without dilution at flow rates of 12 sccm and at 500 mTorr pressure before igniting the plasma. The rf frequency generator was operated at 3.0 MHz with 3 W net absorbed rf power (15 mWcm$^{-2}$).

The gauge reading during depositions generally averaged between 50 and 300 mTorr higher than initial readings without the plasma. Substrate temperature was uncontrolled, but at no time did the baseplate temperature exceed 35° C. Films obtained from the various precursors were bleached by exposure to light at 254 nm, indicating photoinduced oxidation.

EXAMPLE 6

Low energy rf plasma assisted deposition of photosensitive silicon polymers, using the silane precursors of Example 1, was carried out in a PlasmaThermShuttleLock Series 700 plasma etch reactor operating at 13.56 MHz and equipped with an 11" diameter wafer tray which accommodated three 5" diameter wafers.

A silicon polymer film using ethylsilane as the precursor was deposited simultaneously on (A) a 5" Si (100) substrate (B) a 5" Si (100) wafer spin coated previously with a 1.0 μm thick hard baked Shipley resist 1811 and (C) a 5" Si(100) wafer spin coated with 2500 Å of a deep-UV antireflection coating (ARC), Brewer DUV-07, at ambient temperature over a 15 min period, at a nominal flow rate of 50 sccm, $200 \pm 10$ mTorr pressure, $9 \pm 1$ W incident and 0–1 W reflected rf power (power density about 15 mWcm$^{-2}$). A faint glow was visible during the course of the deposition. The refractive index and the thickness of the polymer film on the silicon substrate, as obtained from a nine-point measurement using a Nanometrics Nanoscope, averaged $1.79 \pm 0.03$ and $1550 \pm 50$ Å, respectively. The average film thickness value measured by a Dektak 3030 profilometer was in agreement with that obtained from the Nanoscope measurements.

A $4400 \pm 100$ Å thick film also deposited from ethylsilane precursor was similarly deposited over 40 minutes on a 5" Si (100) substrate with a previously deposited 5000 Å polysilicon layer on 1000 Å $SiO_2$ (D).

The deposited films were removed from the reactor and stored under vacuum and protected from exposure to ambient light until a few minutes prior to patterning. Each of the three Test Samples A–C was patterned in air as described in Example 1 on a GCA Model 2000 Deep UV Stepper, operating at 248 nm, using a resolution mask with exposures in the 50 to 290 mJcm$^{-2}$ range (starting at 50 and increasing by 10 mJ increments; $5 \times 5$ matrix) at best focus. An approximately 150 Å thickness increase resulting from the oxidation was measured in the exposed regions (about 100 mJcm$^{-2}$). Test Sample D was patterned using the same exposure equipment and resolution mask with exposures ranging from 10 to 250 mJcm$^{-2}$ (starting at 10 and increasing by 10 mJ increments; $5 \times 5$ matrix). In each case the latent images were visible through the entire exposure range.

Test Sample A was subjected to a partial, 40 s, $Cl_2$ reactive ion etch under conditions described in Example 1 in a 13.56 MHz ProtoTech Research System 1800 apparatus incorporating an rf helical resonator plasma source and equipped with a laser interference measurement system for thickness loss monitoring. Remaining resist thickness (as determined using a depth profilometer) of the unexposed region was about 400 Å (unoptimized etch rate of about 1725 Å min$^{-1}$) while that in the exposed region varied between 790 and 1250 Å with increasing exposure dose (unoptimized etch rate about 1290 to 590 Å min$^{-1}$) yielding an unoptimized etch selectivity for unexposed relative to exposed regions of about 2:1 at 100 mJcm$^{-2}$ and about 3:1 at greater than 200 mJcm$^{-2}$ exposures.

The top, patterned silicon polymer layer of Test Samples B and C was similarly developed by a 55 s $Cl_2$ reactive ion etch (little or no overetch) under the same conditions. In each case, pattern transfer to the organic underlayer was achieved in the same reactor by switching the reactive ion etching gas to oxygen (25 sccm, 0.80 mTorr, 1800 W incident, approximately 200 W reflected power, −220±20 V bias, back cooled with 35 sccm, 4.8 mTorr He, etch time: 90 s for sample B and 60 s for sample C (including approximately 10% overetch) yielding an etch selectivity for the organic underlayer relative to the resist of greater than 50:1. Examination of the resolution patterns (SEM) showed 0.3 μm lines and spaces intact.

For the test sample D, development of the resist layer and pattern transfer to the polysilicon layer were accomplished in a single $Cl_2$ reactive ion etching step using the conditions described above, with 0.35 μm line and space resolution. The total etch time of 285 s included a 150 s resist etch and a 135 s polysilicon etch (etch rate for polysilicon 2250 Å/min, unoptimized etch selectivity versus the resist at 100 mJcm$^{-2}$ exposure of about 2.5:1).

EXAMPLE 7

A PlasmaLab diode reactor (ordinarily used for $SiO_2$ deposition) operating at 13.56 MHz was employed for plasma assisted deposition of organohydridosilicon films from phenylsilane precursor. A mixture of phenylsilane in hydrogen carrier gas, obtained by bubbling hydrogen (5 psi) through the liquid phenylsilane precursor, was introduced in the deposition chamber at a 80 sccm flow rate and 500±10 mTorr total pressure. The reactor was preconditioned at 150 W incident power (less than 10 W reflected; 750 mWcm$^{-2}$ power density) for 30 min. followed by 9 W incident power for 30 min. to passivate the chamber surface. A 1500 Å thick phenylhydriodosilicon film was deposited over 10 min at 6 W incident power (less than 1 W reflected, power density 32 mWcm$^{-2}$) at 45° C. substrate temperature on 2" diameter GaAs and 2" diameter InP wafer substrates. The test samples A and B were patterned in air at 310 nm on a Karl Suss exposure system operating in contact printing mode, using a standard line-and-space grating mask with 0.5 μm features (200 mJcm$^{-2}$ total exposure). Resist development and pattern transfer to the individual substrates were accomplished in a single reactive ion etch sequence in a PlasmaLab etch system without removing the substrate from the etch chamber using the conditions listed in Table 3 ($Cl_2$—RIE for development followed by $SiCl_4$—RIE and $CH_4/H_2$ plasma etch for pattern transfer into GaAs and InP, respectively).

One micron deep trenches were etched into the GaAs test sample after 10 min of $SiCl_4$—RIE, with selectivity (unoptimized) better than 10:1. A 30 min. $CH_4/H_2$ plasma etch of the InP test sample, similarly yielded 1.5 μm deep trenches into the InP substrate, with selectivity (unoptimized) greater than 5:1.

TABLE 3

| Substrate | Etchant | Flow, sccm | Pressure, mTorr | Power, mWcm$^2$ | Temp, °C. | Time, min |
|---|---|---|---|---|---|---|
| [Ph$_x$SiH$_y$] resist | Cl$_2$ | 10 | 5 | 80 | −10 | 14 |
| GaAs | SiCl$_4$ | 10 | 5 | 160 | −10 | 10 |
| InP | CH$_4$/H$_2$ | 1 20 | 15 | 290 | 80 | 30 |

Films deposited from methylsilane or ethylsilane, as described in Example 5, were exposed to 265 nm light in a contact printing mode. Development was performed as described in this Example. Pattern transfer selectivities greater than 20:1 were observed after the developed films were given a blanket exposure in air.

EXAMPLE 8

Figure 2:
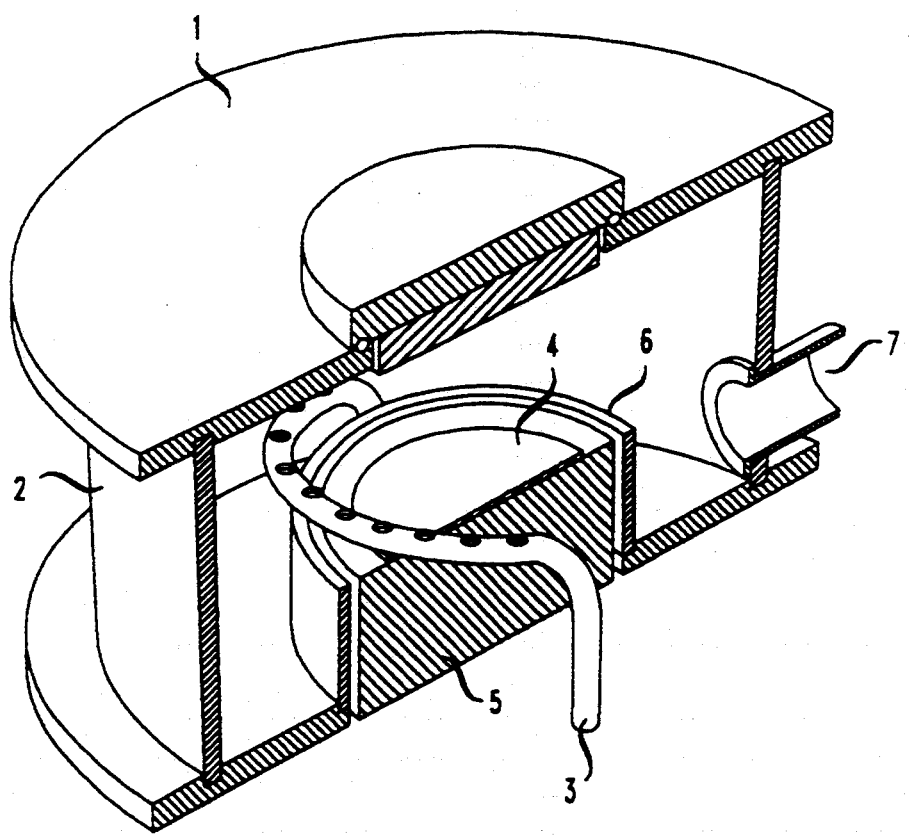

An RIE chamber was used and included a grounded aluminum chamber with a lower powered electrode, the center 4" of which extended through an insulating ⅛" thick ring (FIG. 2). A 13.56 MHz rf generator was tuned and adjusted to produce a faint but stable glow discharge in hydrogen with a total pressure of 100 mTorr confined to the region just above the powered electrode.

Photosensitive amorphous organosiliconhydride polymers were deposited employing methylsilane as a precursor. Depositions were conducted at flow rates of 18 to 22 sccm methylsilane to give working pressures of 80 mTorr without rf power and up to 100 mTorr with rf power. A 13.56 MHz generator was tuned and adjusted so as to produce a faint but stable glow discharge confined to, but filling, the region just above the power electrode (occurring at a power setting of 6 W, corresponding to a power density over the substrate area of 30 mWcm$^{-2}$). Films deposited in freshly cleaned chambers (those having been exposed to a discharge in oxygen and oxygen/Freon 12 mixtures) typically exhibited nonreproducible photoreactivity. The chamber was preconditioned by running at 24 W rf power (120 mWcm$^{-2}$) for 15 minutes, followed by 6 W for 15 min., after which the rf power was terminated and the reactor was then opened under a fast purge of dry nitrogen.

A 4" silicon wafer substrate coated with 1000 Å of aluminum was placed on the electrode and the chamber sealed and evacuated. Metering inlet valves were used to control flow rates and chamber pressure. A uniform film 1500±200 Å was deposited in 5 minutes, and films 4400±600 Å in thickness after 15 minutes. To demonstrate the utility of this process for integrated processing, the reactor was backfilled to about 200 torr of oxygen, and a simple wide line and space pattern was projected through a quartz lens window onto the substrate bearing the 1500 Å film.

The chamber was evacuated and then etching with $SiCl_4$ was performed to develop the image (100 mTorr pressure, 120 mWcm$^{-2}$ power incident on the sample). This procedure accomplished both resist development and etching through the aluminum to the silicon substrate. A 4400 Å thick film was removed from the reactor and exposed to 200 mJcm$^{-2}$ nominally 265 nm light on a 1000 W ORIEL exposure system using a chromium on quartz contact print mask. Patterns were developed (as in Example 7) and transferred into the aluminum by chlorine reactive ion etching using a total pressure of 5 mTorr and flow rates of approximately 10 sccm, with a power density of 80 mWcm$^{-2}$ resulting in no measurable D.C. bias. After 15 minutes both the unexposed resist and 1000 Å of underlying aluminum were removed, while exposed regions retained 3500 Å of oxidized resist protecting the aluminum.

We claim:

1. A process for fabricating an article comprising the steps of forming a layer of radiation sensitive material on a substrate, exposing said material to said radiation to form a pattern and developing said pattern characterized in that said material comprises a silicon polymer represented by the base unit:

$R_xSiH_y$ where $0.2 < x < 1.5$, $0.2 < y < 1.5$ and R is an organic substituent resulting in said material being insoluble.

2. The process of claim 1 wherein said exposure is performed in the presence of oxygen.

3. The process of claim 2 wherein said exposure comprises a blanket exposure of said material.

4. The process of claim 1 wherein said radiation comprises an electron beam.

5. The process of claim 1 wherein said radiation comprises ultraviolet or deep ultraviolet radiation.

6. The process of claim 1 wherein said organic substituent comprises an alkyl or an aryl substituent.

7. The process of claim 1 including the step of transferring said pattern to said substrate by etching.

8. The process of claim 7 wherein said etching comprises a plasma based etching.

9. The process of claim 8 wherein said plasma is employed both for said developing and for said etching.

10. The process of claim 1 wherein said forming and said developing is performed without subjecting said substrate to the ambient environment.

11. A process for fabricating an article comprising the steps of forming a layer of radiation sensitive material on a substrate, exposing said material to said radiation to form a pattern and developing said pattern characterized in that said material is formed by discharge in a precursor gas such that said material comprises a compound represented by the base unit $R_xSiH_y$ where $0.2 < x < 1.5$, $0.2 < y < 1.5$ and R is an organic substituent.

12. The process of claim 11 wherein said exposure is performed in the presence of oxygen.

13. The process of claim 12 wherein said exposure comprises a blanket exposure of said material.

14. The process of claim 11 wherein said radiation comprises ultraviolet or deep ultraviolet light.

15. The process of claim 11 wherein said organic substituent comprises an alkyl or an aryl substituent.

16. The process of claim 11 including the step of transferring said pattern to said substrate by etching.

17. The process of claim 16 wherein said etching comprises a plasma based etching.

18. The process of claim 8 wherein said plasma is employed both for said developing and for said etching.

19. A process for fabricating an article comprising the step of forming a layer of radiation sensitive material on a substrate, exposing said material to said radiation to form a pattern and developing said pattern characterized in that said material is formed by discharge in a precursor comprising a compound represented by the formula $RSiH_3$ wherein R is an organic substituent.

20. The process of claim 19 wherein said organic substituent comprises an alkyl or aryl substituent.

21. The process of claim 19 wherein said forming and said developing is performed without subjecting said substrate to the ambient environment.

22. A process for fabricating an article comprising the steps of forming a layer of radiation sensitive material on a substrate, exposing said material to said radiation to form a pattern, developing said pattern and transferring said pattern to said substrate characterized in that said development and said transferring is performed without exposing said substrate to the ambient.

23. The process of claim 1 wherein said body comprises a device and wherein said layer forms a region of said device.

24. The process of claim 11 wherein said body comprises a device and wherein said layer forms a region of said device.

* * * * *